United States Patent [19]

Matsumoto

[11] Patent Number: 4,719,155
[45] Date of Patent: Jan. 12, 1988

[54] EPITAXIAL LAYER STRUCTURE GROWN ON GRADED SUBSTRATE AND METHOD OF GROWING THE SAME

[75] Inventor: Takashi Matsumoto, Tokyo, Japan
[73] Assignee: NEC Corporation, Tokyo, Japan
[21] Appl. No.: 788,628
[22] Filed: Oct. 17, 1985

[30] Foreign Application Priority Data

Oct. 17, 1984 [JP] Japan ................. 59-217747

[51] Int. Cl.⁴ .................. B32B 9/00; H01L 29/161
[52] U.S. Cl. ....................... 428/700; 357/16; 357/30
[58] Field of Search ........... 428/700; 156/610; 357/16, 30; 148/171

[56] References Cited

U.S. PATENT DOCUMENTS 4,053,920 10/1977 Enstrom ....................... 357/30
4,439,399 3/1984 Hawrylo ....................... 148/171
4,616,241 10/1986 Biefeld et al. ................. 357/16

OTHER PUBLICATIONS

Crystals, Growth, Properties, Applications, p. 80, Springer-Verlag, 1978.

Primary Examiner—John E. Kittle
Assistant Examiner—Patrick J. Ryan
Attorney, Agent, or Firm—Burns, Doane, Swecker & Mathis

[57] ABSTRACT

An intentional lattice mismatch, $\Delta a/a$ where $\Delta a$ is a difference in the lattice constant of a constant-composition layer and an epitaxial layer and a is the lattice constant of the constant-composition layer, is introduced into the epitaxial layer of a crystal structure having a graded composition layer sandwiched between a single crystal bulk substrate and the constant composition layer so as to alleviate strain resulting from a lattice constant variation in the graded substrate.

7 Claims, 1 Drawing Figure

EPITAXIAL LAYER STRUCTURE GROWN ON GRADED SUBSTRATE AND METHOD OF GROWING THE SAME

BACKGROUND OF THE INVENTION

The present invention relates to an epitaxial layer structure grown on a graded substrate and a method of epitaxial growth on the graded substrate.

At present, mixed crystals of various semiconductor material such as GaAlAs, InGaAsP, InGaAlAsP, and ZnCdSSe are used as epitaxial layer for a semiconductor device, which is grown on a substrate of a similar mixed crystal. In the case of InGaAsP quaternary mixed crystal, for example, it is possible to achieve a wide range of energy bandgaps from 0.36 eV to 2.25 eV by varying the composition of the mixed crystal from InAs to GaP. For this reason, the InGaAsP epitaxial layer is available for various optoelectric semiconductor devices such as laser diodes, light-emitting diodes, and photo detectors wherein the InGaAsP layer can have a desired wavelength ranging from the infrared region to the visible region.

Generally speaking, if a crystal having a lattice constant different from that of the substrate is grown on the substrate, a lot of misfit dislocations are introduced from its interface into a grown layer, which undermines the crystal quality of the grown layer. Consequently, the surface condition of the grown crystal is also adversely affected, making it impossible to obtain usable crystals.

Since the epitaxial layer should be lattice-matched to the substrate, possible bandgap range of the epitaxial layer depends on the composition of the substrate. For instance, when the InGaAsP layer is grown on an InP substrate with a lattice match condition, the bandgap range is restricted to 0.75 eV to 1.28 eV. When the GaAs substrate is used, the bandgap is restricted to the range between 1.48 eV and 1.88 eV. To expand the possible bandgap range, ternary or quarternary substrate is required instead of conventional binary substrate. However, it is very difficult to obtain a bulk single crystal substrate for the ternary or quarternary system.

To this end, so-called graded substrate is commercially available. The graded substrate comprises a binary bulk single crystal substrate, a graded composition layer formed on the binary substrate, and a constant composition layer formed on the graded composition layer. A typical example of such a commercially available $GaAs_{0.61}P_{0.39}$ wafers consists of a 30 $\mu$m-thick graded composition GaAsP layer on a GaAs substrate and a 20 $\mu$m-thick constant composition $GaAs_{0.61}P_{0.39}$ layer on top of the wafer. Using this wafer as the graded substrate for growing a desired ternary or quarternary epitaxial layer such as InGaP or InGaAsP thereon, however, the grown surface has a so called cross-hatched pattern and a number of small surface defects appear when InGaP and InGaAsP layers are grown under the lattice matched condition on the GaAsP graded substrate. To achieve a good semiconductor device, therefore, it is necessary to eliminate the above mentioned deffects.

Accordingly, an object of the present invention is to provide a crystal structure having a graded substrate and an epitaxial layer grown on the graded substrate and a method making the same with a good surface condition and crystal quality by eliminating the aforementioned conventional drawbacks.

The present invention is featured in that an intentional lattice mismatch is introduced between the epitaxial layer crystal and the graded substrate surface by the value of $\Delta a/a = 1 \times 10^{-3}$ to $5 \times 10^{-3}$ ($\Delta a$: a difference in the lattice constant between the top layer of the graded substrate and the grown layer thereon, a: the lattice constant of the top layer of the graded substrate) so as to alleviate a strain resulting from a change in the lattice constant within the graded substrate. When the lattice constant in the graded layer is increased from a lower layer (bulk substrate) toward the top layer (the constant layer), the lattice constant of the epitaxial layer should be selected to be smaller than that of the constant layer. On the other hand, when the lattice constant of the graded layer is decreased from bulk substrate toward the constant layer, the lattice constant of the grown layer should be selected to be larger than that of the constant layer.

DETAILED DESCRIPTION OF THE PREFERRED EMBODIMENTS

Figure 1:
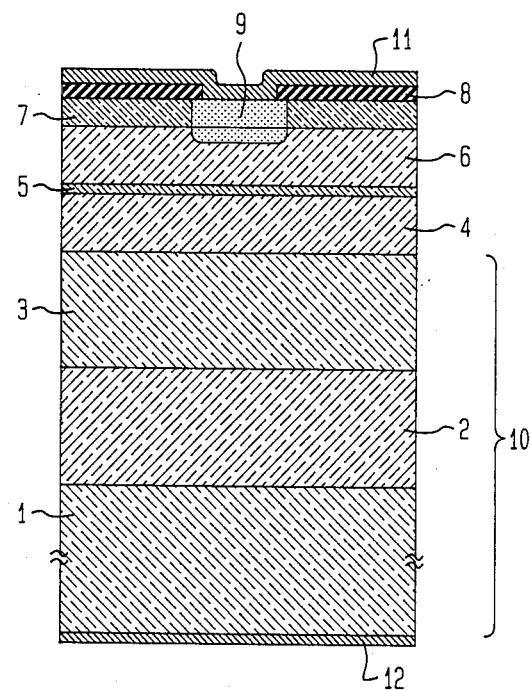
FIG. 1 shows a schematic cross-sectional view of a double heterojunction structure for a planer stripe semiconductor laser.

Double heterojunction (DH) structures for semiconductor laser diodes are prepared for the following respective cases: a conventional case where lattice match is carried out on a graded substrate in which a mixed crystal of $GaAs_{1-y}P_y$ (y=0.4) is subjected to graded epitaxial growth on a GaAs bulk crystal and a case of the present invention where lattice mismatch is intensionally introduced so as to alleviate a strain. Then, a comparison was made in surface conditions and lasing characteristics which are substantially affected by crystal quality.

FIG. 1 shows the structure of an epitaxial layer grown by the hydride vapor-phase-epitaxy (VPE) method. A GaAsP graded substrate 10 consists of a bulk single crystal 1, a graded composition layer 2 grown thereon, and a constant composition layer 3 thereon. As the bulk crystal 1, approximately 300 $\mu$m-thick GaAs bulk single crystal was used. The graded layer 2 is a grown layer in which 30 $\mu$m-thick composition is changed by small degrees from $GaAs_{1-y}P_y$ (y=0) to $GaAs_{1-y}P_y$ (y=0.40) in thickness direction. The constant layer 3 is an about 30 $\mu$m-thick $GaAs_{1-y}P_y$ (y=0.40) layer, its composition being constant. Then, the following were consecutively grown on the constant layer 3: a 2 $\mu$m-thick n-InGaP layer as an n-type clad layer 4, a 2000 Å-thick InGaAsP layer as an active layer 5, a 2 $\mu$m thick P-InGaP layer as a P-type clad layer 6, and a 1 $\mu$m-thick InGaAsP layer as a cap layer 7, which constitute a DH structure for a semiconductor laser.

The n-type InGaP clad layer 4 was Se-doped by approximately $7 \times 10^{17}$ cm$^{-3}$ as an n-type dopant, while the p-type InGaP clad layer 6 was Zn-doped by approximately $2 \times 10^{18}$ cm$^{-3}$ as a p-type dopant, respectively. The InGaAsP active and cap layers were undoped.

A comparison was made between the case where the above-described DH structure for laser diodes (LD) were grown on the constant layer 3 of $GaAs_{1-y}P_y$ (y=0.4) with lattice match and the case where growth was effected by introducing a lattice mismatch $\Delta a/a$ of about $+1\times10^{-3}$ to $+5\times10^{-3}$ so as to alleviate the strain which is inherently present in the graded substrate.

In the case where lattice match was effected, the composition of each grown layer was $In_{1-x}Ga_xP$ ($x=0.71$) for both the n-clad layer 4 and the p-clad layer 6, and $In_{1-x}Ga_xAs_{1-y}P_y$ ($x=0.97$, $y=0.45$) for both the cap layer 7 and the active layer J. The lattice constants of these mixed crystals are matched to the lattice constant ($a=5.5$ Å) of the constant layer 3 of the $GaAs_{1-y}P_y$ ($y=0.40$) graded substrate by about 66 $a/a<5\times10^{-4}$.

Meanwhile, in the case of the present invention in which intentional lattice mismatch was introduced in the direction of alleviating a strain which is internally present in the graded epitaxial substrate, the composition was $In_{1-x}Ga_xP$ ($x=0.67\pm0.02$) for both the n-clad layer 4 and the p-clad layer 6, and $In_{1-x}Ga_xAs_{1-y}P_y$ ($x=0.93\pm0.02$, $y=0.45$) for both the cap layer 7 and the active layer 5. The lattice mismatch ($\Delta a/a$) of these epitaxial layers with respect to the lattice constant ($a=5.57$ Å) of the constant layer 3 of the $GaAs_{1-y}P_y$ ($y=0.40$) graded substrate was about $+1\times10^{-3}$ to $5\times10^{-3}$ at room temperature, and the lattice mismatch between each adjacent layer of both clad layers, active layer, and cap layer was within $\pm5\times10^{-4}$.

As a result of preparing DH structure for various LDs, observation by the Normalsky differential interference microscope revealed that many fine irregularities occurred on the surface of the lattice-matched epitaxial layers, and a deteriorated specular surface was detected. However, as for the surface condition of the epitaxial layers of the present invention to which a lattice mismatch of $+1\times10^{-3}$ to $+5\times10^{-3}$ at room temperature was introduced to alleviate a strain, the results of similar observation were favorable and showed a good specular surface. If $\Delta a/a$ exceeded $+5\times10^{-3}$, the inherent adverse effect of lattice mismatch emerges instead of the effect of alleviating a strain. The lower limit of $\Delta a/a$ at which the effect of the present invention can be detected is $+1\times10^{-3}$, and a deteriorated specular surface can be noted at a level lower than that. Furthermore, using wafers of these DH structures for LDs, Zn-diffused planner stripe-type LDs with a stripe width of 18 μm were fabricated, and a comparison was made of their oscillating threshold current density by pulse operation at room temperature. The reflective Zn-diffusion was performed through the window of $SiO_2$ layer 8 so as to reach the P-type clad layer 7. Ohmic contacts to the p-side and the n-side were made by Au-Zn layer 11 and Au-Ge-Ni layer 12, respectively. The LDs prepared from wafers of lattice matched DH structures for LDs were pulsed at a threshold current density of $Jth=25$ kA/cm$^2$ to 35 kA/cm$^2$ at room temperature, but no continuous wave (CW) operation was obtained and yield was low (less than 50%). However, in the case of LDs of the present invention prepared from wafers of DH structures to which lattice mismatch was introduced by about $\Delta a/a=3.7\times10^{-3}$ at room temperature, the CW operation at room temperature was obtained at a threshold current density of $Jth=3$ kA/cm$^2$.

As described above, it has been found that the aforementioned problems can be resolved if growth is effected by intentionally carrying out a lattice mismatch of approximately $\Delta a/a$: $+1\times10^{-3}$ to $+5\times10^{-3}$ with the constant composition layer. Preferably, $\Delta a/a$ is selected to be in the range of $3\times10^{-3}$ to $4\times10^{-3}$.

The aforementioned value of lattice-mismatch is very large as compared with the critical value of allowable lattice mismatch (generally $\Delta a/a$: $15\times10^{-4}$ or thereabout) at which it is conventionally considered that an epitaxial layer without any misfit dislocation can be obtained in cases where a layer of InGaP or InGaAsP is epitaxially grown on a GaAs bulk crystal substrate. The fact that the epitaxial layer with such a great lattice mismatch yields a better specular surface than a lattice-matched epitaxial layer is a remarkable phenomenon.

The reunion for this phenomenon can be surmised as follows: It can be considered that a portion of a stress caused as a result of a difference in the lattice constant between a GaAs substrate and a GaAsP epitaxial growth layer is aleviated by misfit displacements or the like, while some other portion is stored in the GaAsP graded layer and GaAsP constant layer as a strain. It is considered that when epitaxial growth is effected on a substrate where such a strain is inherently present, a better epitaxial layer can be obtained if a lattice mismatch to the extent of alleviating the strain is incorporated into the epitaxial growth.

With respect to the growth on a GaAsP graded substrate subjected to graded epitaxial growth using a GaP bulk single crystal in such a manner that the lattice constant will become large, a favorable specular surface can be obtained for the aforementioned reason if an epitaxial layer having a small lattice constant of $\Delta a/a$ being $-1\times10^{-3}$ to $-5\times10^{-3}$ is grown.

More specifically, DH structures for LDs were prepared for the following respective cases: a case where lattice match is carried out on a substrate in which an $InAs_{1-y}P_y$ ($y=0.70$) mixed crystal is subjected to graded epitaxial growth on an InP bulk single crystal and case of the present invention where lattice mismatch is introduced intentionally so as to alleviate a strain. Then, a comparison was made in surface conditions and laser characteristics. The hybrid VPE method was used to achieve growth, and its structure is identical as the one shown in FIG. 1.

More specifically, as for the InAsP graded substrate, an approximately 300 μm-thick InP bulk single crystal was used as the crystal 1. The graded layer 2 is a grown layer in which a 30 μm-thick mixed crystal composition layer is charged by small degrees from $InAs_{1-y}P_y$ ($y=1.0$) to $InAs_{1-y}P_y$ ($y=0.70$). The constant layer 3 is an about 30 μm-thick $InAs_{1-y}P_y$ ($y=0.70$) layer, its mixed crystal composition being constant. Then, the following were consecutively grown on the constant layer 3: a 2 μm-thick n-InAsP layer as the n-type clad layer 4, a 2000 Å-thick InGaAsP layer as the active layer 5, a 2 μm-thick P-InAsP layer as the p-type clad layer 6, and a 1 μm-thick InGAAsP layer as the cap layer 7, which constitute a DH structure for a LD. The n-type InAsP clad layer 4 was Se-doped by approximately $1\times10^{18}$ cm$^{-3}$ as an n-type dopant, while the p-type InAsP clad layer 6 was Zn-doped by approximately $2\times10^{18}$ cm$^{-3}$ as a p-type dopant, respectively. The InGaAsP active and cap layers were undoped.

A comparison was made between the case where the above-described DH structures for LDs were grown on the constant layer 3 of $InAs_{1-y}P_y$ ($y=0.70$) with lattice match and the case of the present invention where growth was effected by introducing a lattice mismatch $\Delta a/a$ of about $-1\times10^{-3}$ to $-5\times10^{-3}$ to alleviate the strain.

In the case where lattice match was effected, the composition of each grown layer was $InAs_{1-y}P_y$ (y=0.70) for both the n-clad layer 4 and the p-clad layer 6, and $In_{1-x}Ga_xAs_{1-y}P_y$ (x=0.29, y=0.10) for both the cap layer 7 and the active layer 8. The lattice constants of these mixed crystals are matched to the lattice constant (a=5.925 Å) of the $InAs_{1-y}P_y$ (y=0.70) graded substrate by about $\Delta a/a \leq 5\times 10^{-4}$.

In the case of the present invention in which lattice mismatch was introduced so as to alleviate a strain, the composition was $InAs_{1-y}P_y$ (y=0.20±0.06) for both the n-clad layer $\phi$ and to p-clad layer 6, and $In_{1-x}Ga_x As_{1-y}P_y$ (x=0.33±0.03, y=0.10) for both the cap layer 7 and the active layer 5. The lattice mismatch ($\Delta a/a$) of these epitaxial layers with respect to the lattice constant (a=5.925 Å) of the $InAs_{1-y}P_y$ (y=0.70) graded substrate was about $-1\times 10^{-3}$ to $-5\times 10^{-3}$, and the lattice mismatch between adjacent layers of both clad layers, active layer and cap layer was within $\pm 5\times 10^{-4}$. As a result of preparing DH structures for various LDs, observation with a Normalsky differential interference microscope revealed a determination in the surface morphology in terms of the surface condition of the lattice-matched epitaxial layers. However, the same observation was made of the surface condition of the epitaxial layers of the present invention to which lattice mismatch was introduced to alleviate a strain, and the surface morphology was favorable. Furthermore, using wafers of these DH structures for LDs, Zn-diffused planar stripe-type LDs with a stripe width of 7 μm were fabricated, and a comparison was made of their oscillating threshold current density. The LDs prepared from wafers of lattice-matched DH structures for LDs continuously operated at a threshold current density of Jth=6 to 8 kA/cm² at room temperature.

However, the average oscillating threshold current density was Jth=5 kA/cm² during room-temperature CW operation of LDs of the present invention, prepared from wafers of DH structures to which lattice mismatch was introduced is as to alleviate a strain. The minimum value was Jth=2 kA/cm² in the case of those prepared from wafers of DH structures for LDs to which a lattice mismatch of about $\Delta a/a = -3.1\times 10^{-3}$ was introduced.

As described above, if the epitaxial technique of the present invention is used, it becomes possible to form epitaxial layers with good surface conditions and crystal qualities on graded substrates as compared with the conventional method. Needless to say, the present invention, can be applied to any other known semiconductor device which are grown on a graded substrate.

What is claimed is:

1. A crystal structure comprising:
a single crystal bulk substrate having a first lattice constant,
a graded-composition layer formed on said bulk substrate,
a constant-composition layer formed on said graded-composition layer, said graded-composition layer and said constant composition layer having a second lattice constant which is different from said first lattice constant, and
an epitaxial layer grown on said constant-composition layer with an intentional lattice mismatch $\Delta a/a$ therebetween (wherein $\Delta a$ is a difference in the lattice constant between said constant-composition layer and said epitaxial layer, and a is the lattice constant of said constant-composition layer), the value of $\Delta a/a$ being in the range of $1\times 10^{-3}$ to $5\times 10^{-3}$ so as to alleviate a strain stored in said graded-composition layer and constant-composition layer due to the difference of said first and second lattice constants.

2. A crystal structure as set forth in claim 1, wherein the epitaxial layer is selected from the group comprising GaAlAs, InGaAsP, and InGaAlAsP and ZnCdSSe.

3. A crystal structure as set forth in claim 1, wherein said crystal structure is a laser diode.

4. A crystal structure as set forth in claim 1 wherein $\Delta a/a$ is from $3\times 10^{-3}$ to $4\times 10^{-3}$.

5. A crystal structure comprising:
a single crystal bulk substrate selected from the group consisting of GaAs, GaP and InP,
a graded-composition layer formed on said bulk substrate, said graded-composition layer being selected from the group consisting of GaAsP and InAsP,
a constant-composition layer formed on said graded-composition layer, said constant-composition layer being selected from the group consisting of GaAsP and InAsP, and
an epitaxial layer grown on said constant-composition layer with an intentional lattice mismatch $\Delta a/a$ therebetween (wherein $\Delta a$ is a difference in the lattice constant between said constant-composition layer and said epitaxial layer, and a is the lattice constant of said constant-composition layer), the value of $\Delta a/a$ being in the range of $1\times 10^{-3}$ to $5\times 10^{-3}$ so as to alleviate a strain stored in said graded-composition layer and constant-composition layer, said epitaxial layer being selected from the group consisting of GaAlAs, InGaAsP, InGaAlAsP, ZnCdSSe and InGaP.

6. A crystal structure comprising:
a graded substrate having a graded-composition layer sandwiched between a single crystal bulk substrate and a constant-composition layer, said graded substrate inherently storing a strain due to a difference in the lattice constant between said single crystal bulk substrate and both of said graded-composition layer and constant-composition layer, and
an epitaxial layer grown on said constant-composition layer with an intentional lattice mismatch $\Delta a/a$ therebeween (wherein $\Delta a$ is a difference in the lattice constant between said constant-composition layer and said epitaxial layer, and a is the lattice constant of said constant-composition layer), the value of $\Delta a/a$ being in the range of $3\times 10^{-3}$ to $5\times 10^{-3}$ so as to alleviate said strain stored in said graded substrate.

7. In a crystal structure comprising an epitaxial layer grown on a graded substrate having a graded-composition layer sandwiched between a single crystal bulk substrate and a constant-composition layer, the improvement in that an intentional lattice mismatch $\Delta a/a$ of about $1\times 10^{-3}$ to $5\times 10^{-3}$ (wherein $\Delta a$ is a difference in the lattice constant between said constant-composition layer and said epitaxial layer, and a is the lattice constant of said constant-composition layer) is introduced into said epitaxial layer such that when the lattice constant in said graded-composition layer increases in the direction from said single crystal bulk substrate toward said constant-composition layer, the lattice constant of said epitaxial layer is larger than that of said constant-composition layer and when the lattice constant in said graded-composition layer decreases in the direction from said single crystal bulk substrate toward said constant-composition layer, the lattice constant of said epitaxial layer is smaller than that of said constant-composition layer.

* * * * *